(12) United States Patent
Wu et al.

(10) Patent No.: US 10,177,346 B2
(45) Date of Patent: Jan. 8, 2019

(54) SUBSTRATE UNIT, DISPLAY DEVICE AND METHOD FOR MANUFACTURING DISPLAY DEVICE

(71) Applicant: InnoLux Corporation, Jhu-Nan, Miao-Li County (TW)

(72) Inventors: Wei-Yen Wu, Jhu-Nan (TW); Yu-Yao Chen, Jhu-Nan (TW); Jiun-Ru Tzeng, Jhu-Nan (TW); Chi-Che Tsai, Jhu-Nan (TW); Ker-Yih Kao, Jhu-Nan (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 240 days.

(21) Appl. No.: 15/183,527

(22) Filed: Jun. 15, 2016

(65) Prior Publication Data

US 2017/0017102 A1 Jan. 19, 2017

(30) Foreign Application Priority Data

Jul. 17, 2015 (TW) .............................. 104123336 A

(51) Int. Cl.
*G02F 1/1339* (2006.01)
*B32B 38/18* (2006.01)
(Continued)

(52) U.S. Cl.
CPC .............. *H01L 51/56* (2013.01); *B32B 17/00* (2013.01); *B32B 37/025* (2013.01); *B32B 38/1808* (2013.01); *H01L 27/326* (2013.01); *H01L 51/0096* (2013.01); *H01L 51/524* (2013.01); *B32B 2037/1253* (2013.01); *B32B 2309/105* (2013.01); *B32B 2310/0831* (2013.01);
(Continued)

(58) Field of Classification Search
None
See application file for complete search history.

(56) References Cited

U.S. PATENT DOCUMENTS 5,766,493 A 6/1998 Shin
7,589,798 B2 9/2009 Takahata et al.
(Continued)

FOREIGN PATENT DOCUMENTS

TW 201119864 A1 6/2011
TW 201202030 A1 1/2012
(Continued)

*Primary Examiner* — Ashok Patel
(74) *Attorney, Agent, or Firm* — Muncy, Geissler, Olds & Lowe, P.C.

(57) ABSTRACT

A substrate unit, a display device, and a method for manufacturing the display device are disclosed. The method for manufacturing the display device includes the steps of: providing a first carrier plate and forming a first interlayer on the first carrier plate; disposing a first glass substrate on the first interlayer to form a first substrate unit; forming a first device layer on the first glass substrate to obtain a first device substrate; providing a second carrier plate and forming a second interlayer on the second carrier plate; disposing a second glass substrate on the second interlayer to form a second substrate unit; combining the first device substrate with the second substrate unit; separating the first glass substrate from the first interlayer; and separating the second glass substrate from the second interlayer to obtain the display device.

8 Claims, 12 Drawing Sheets

(51) Int. Cl.
| | | |
|---|---|---|
| *G02F 1/1333* | (2006.01) | |
| *G02F 1/1335* | (2006.01) | |
| *G02F 1/1368* | (2006.01) | |
| *H01L 27/32* | (2006.01) | |
| *G02F 1/1341* | (2006.01) | |
| *G02F 1/1343* | (2006.01) | |
| *H01L 51/00* | (2006.01) | |
| *H01L 51/52* | (2006.01) | |
| *H01L 51/56* | (2006.01) | |
| *B32B 17/00* | (2006.01) | |
| *G06F 3/041* | (2006.01) | |
| *B32B 37/00* | (2006.01) | |
| *G02F 1/13* | (2006.01) | |
| *G06F 3/044* | (2006.01) | |
| *B32B 37/12* | (2006.01) | |

(52) U.S. Cl.
CPC ....... *B32B 2315/08* (2013.01); *B32B 2457/20* (2013.01); *B32B 2457/206* (2013.01); *B32B 2457/208* (2013.01); *G02F 1/1303* (2013.01); *G02F 1/13338* (2013.01); *G02F 2001/1316* (2013.01); *G02F 2001/13415* (2013.01); *G02F 2001/133331* (2013.01); *G02F 2202/28* (2013.01); *G06F 3/044* (2013.01); *G06F 2203/04103* (2013.01); *H01L 2251/558* (2013.01); *Y02E 10/549* (2013.01)

(56) References Cited

U.S. PATENT DOCUMENTS

| | | | |
|---|---|---|---|
| 2012/0228617 A1* | 9/2012 | Ko | H01L 51/0097 257/59 |
| 2013/0075739 A1* | 3/2013 | Loy | H01L 21/6835 257/60 |
| 2014/0290841 A1 | 10/2014 | Tsai | |
| 2015/0004306 A1* | 1/2015 | Cho | G02F 1/133351 427/58 |

FOREIGN PATENT DOCUMENTS

| | | |
|---|---|---|
| TW | 201437313 A | 10/2014 |
| TW | 201514110 A | 4/2015 |

* cited by examiner

SUBSTRATE UNIT, DISPLAY DEVICE AND METHOD FOR MANUFACTURING DISPLAY DEVICE

CROSS REFERENCE TO RELATED APPLICATIONS

This Non-provisional application claims priority under 35 U.S.C. § 119(a) on Patent Application No(s). 104123336 filed in Taiwan, Republic of China on Jul. 17, 2015, the entire contents of which are hereby incorporated by reference.

BACKGROUND OF THE INVENTION

Field of Invention

The invention relates to a substrate unit, a display device, and a method for manufacturing the display device.

Related Art

With the advance of technology, flat display devices have been broadly applied to various fields, for example liquid crystal display devices or organic light emitting diode (OLED) display devices. Because flat display devices have superior characteristics of compact volume, low power consumption and low radiation, they gradually replace conventional cathode ray tube display devices and are applied to various electronic products such as mobile phones, portable media devices, laptops, tablet computers, and other display devices.

Because of large-scale, thin and lightweight requirements of a display device, a thinner glass substrate of a display panel is developed from the thickness of 0.5 mm-0.7 mm to the thickness of 0.3 mm (or less). However, if the thickness of the glass substrate is equal to or less than 0.3 mm, the process of forming semiconductor devices for displaying on the surface of the glass substrate cannot be implemented by the existing manufacturing equipment due to thinness and insufficient rigidity of the thin glass substrate.

One conventional solution is to attach a thin glass to another thicker glass carrier plate to increase its rigidity, and then they will be separated after the manufacturing process is accomplished. However, in a subsequent high temperature process (higher than 250° C. for example), silicon and oxygen bonds (—Si—O—Si—) between the glass carrier plate and the thin glass are formed, which results in difficult separation between the thin glass and the glass carrier plate.

Another conventional solution is to attach a thin glass to a glass carrier plate by adhesion using glue material. However, because general glue materials have poor heat resistances, excess glue or bubbles occur during coating. Moreover, some residual glue during separation results in less efficiency for recycling the glass carrier plate.

SUMMARY OF THE INVENTION

An aspect of the disclosure is to provide a substrate unit, a display device, and a method for manufacturing the display device adapted to the existing manufacturing equipment for production and meeting the large-scale, thin and lightweight requirements of display device.

A method for manufacturing the display device includes the steps of: providing a first carrier plate and forming a first interlayer on the first carrier plate; disposing a first glass substrate on the first interlayer to form a first substrate unit; forming a first device layer on the first glass substrate to obtain a first device substrate; providing a second carrier plate and forming a second interlayer on the second carrier plate; disposing a second glass substrate on the second interlayer to form a second substrate unit; oppositely placing and then combining the second substrate unit and the first device substrate; and separating the first glass substrate from the first interlayer and separating the second glass substrate from the second interlayer to obtain the display device. Alternatively, the method may further include the steps of: separating the second glass substrate from the second interlayer; forming an electrode layer on an exterior surface of the second glass substrate away from the first glass substrate; and separating the first glass substrate from the first interlayer to obtain the display device. By the manufacturing process mentioned above, the substrate unit and the display device can be produced by the existing manufacturing equipment, and the display device can also meet the large-scale, thin and lightweight requirements.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

A cleaning process such as water wash or ozone ashing is performed on the surfaces of a carrier plate and a thin glass substrate before a process for thinning the display device. After the cleaning process, hydroxyl groups (—OH) are formed on the surfaces of the carrier plate and the thin glass substrate. If the carrier plate is directly attached to the thin glass substrate, a subsequent high temperature process (>250° C.) will cause reactions of hydroxyl groups between them to form silicon and oxygen bonds (—Si—O—Si—) so the carrier plate and the thin glass substrate will not be easily separated and it is difficult to make the display device thinner and recycle the carrier plate for reuse. The disclosure provides the following manufacturing process to avoid the aforementioned problems. The process is implemented by the existing manufacturing equipment for production, and the produced display device meets the large-scale, thin and lightweight requirements. Technologies of a substrate unit, a device substrate, and a display device including a substrate unit and a device substrate can be realized by the following detailed description of a method for manufacturing a display device.

Referring to FIG. 1 and FIG. 2A to FIG. 2G, FIG. 1 is a flow chart of steps of a method for manufacturing a display device according to an embodiment, and FIG. 2A to FIG. 2G are schematic diagrams of the manufacturing process of the display device 3 according to the first embodiment.

Figure 1:
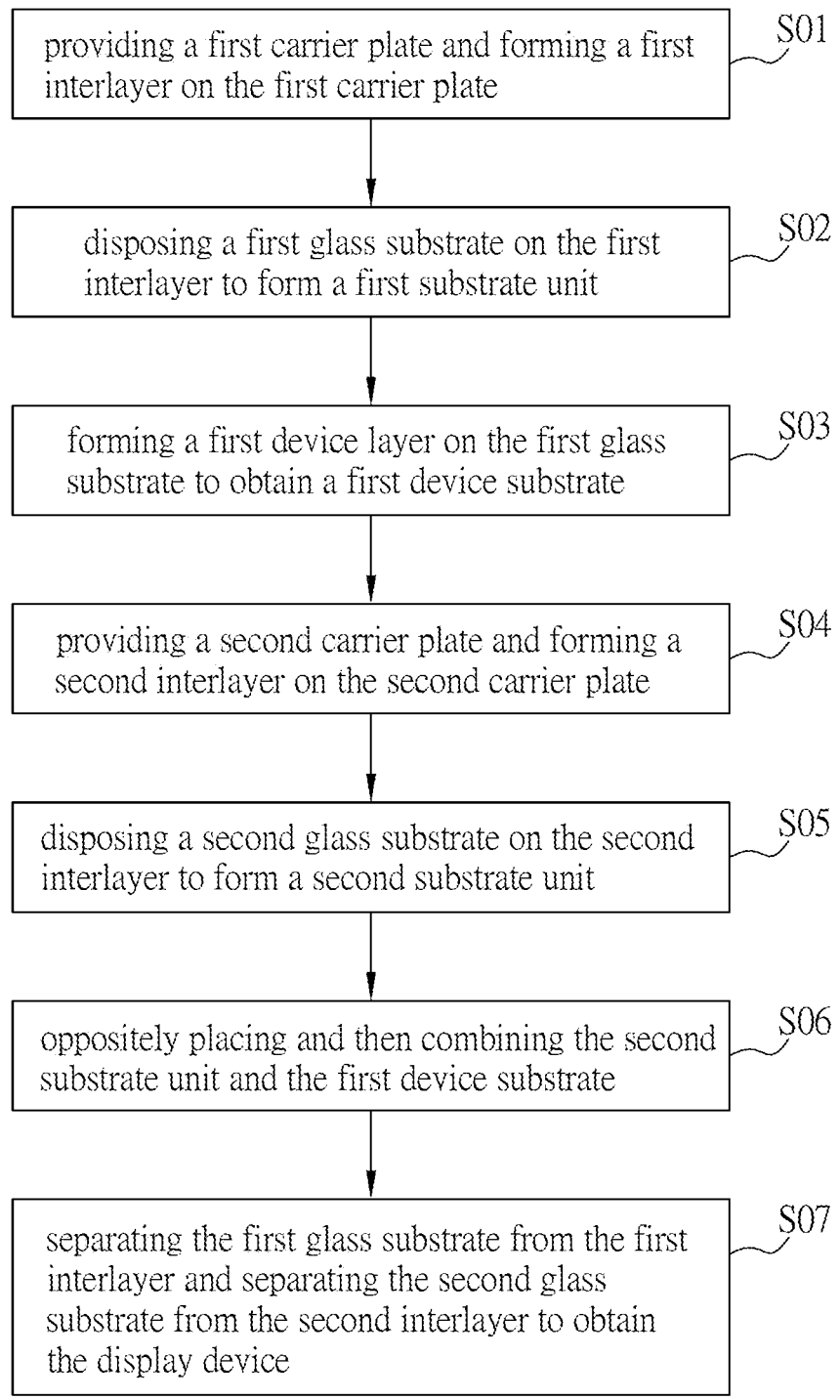
FIG. 1 is a flow chart of the steps of the method for manufacturing a display device according to an embodiment.

As shown in FIG. 1, the method for manufacturing the display device includes the step S01 to the step S07.

Figure 2A:
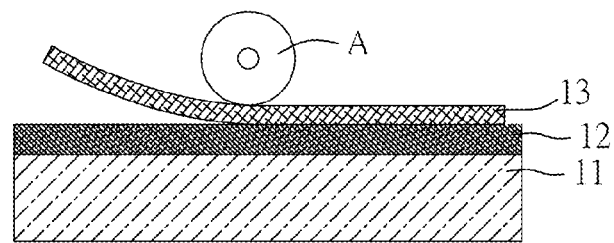
FIG. 2A to FIG. 2G are schematic diagrams of the manufacturing process of the display device according to the first embodiment.
Figure 2B:
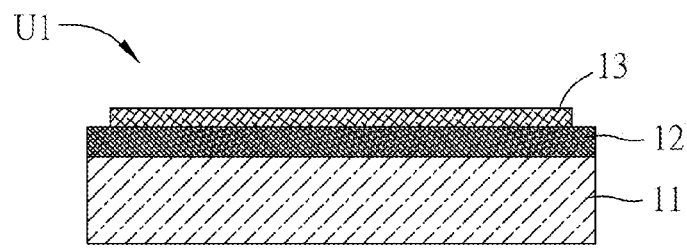

First, as shown in FIG. 1 and FIG. 2A, the step S01 is to provide a first carrier plate 11 and form a first interlayer 12 on the first carrier plate 11. Here, the first carrier plate 11 for example a glass carrier plate or a silicon substrate is heat resistant, and it may still be thick enough to be a support and meet the requirement of thickness for a process machine. The first interlayer 12 is formed on the first carrier plate 11 by, for example, a coating method such as dip coating, roll coating, print coating, spin coating or the like, but it is not limited thereto. Moreover, the first interlayer 12 can be coated on the first carrier plate 11 and 2 to 5 mm distant from the edge of the first carrier plate 11 by physical vapor deposition (PVD), chemical vapor deposition (CVD), slit coater, or other coating equipment. In addition, the first interlayer 12 can tolerate high temperature of 250° C. to 800° C., preferably, 600° C. to 800° C. It can also tolerate a subsequent semiconductor device process for amorphous silicon (a-Si), amorphous indium gallium zinc oxide (a-IGZO), c-axis aligned crystal indium gallium zinc oxide (CAAC-IGZO), low temperature poly silicon (LTPS) or the like. The material of the first interlayer 12 can be a metal, a metal oxide (e.g. indium tin oxide (ITO)), a silicon oxide (e.g. SiOx), an organosilicon compound, an organotitanium compound, an organoaluminum compound, or an organic polymer, and it is not limited thereto.

In one embodiment, the first interlayer 12 may be formed by, for example, the below organosilicon compound:

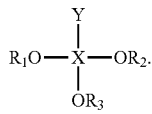

Here, R1, R2 and R3 are each independently C1-6 alkyl groups, X is silicon (Si), titanium (Ti) or aluminum (Al), and Y is a hydrophobic functional group. When the first carrier plate 11 is coated with the above compound, a hydroxyl group (—OH) formed by hydrolysis and self-condensation can act as a reactive functional group to react with a hydroxyl group exposed on the surface of the first carrier plate 11 so as to form a bond. Then, after further hydrolysis and condensation reactions, part or all of the bonds can be condensed and form oxygen bonds, which results in difficult separation between the first carrier plate 11 and the first interlayer 12. Moreover, because the hydrophobic functional groups Y will not react with the first carrier plate 11, the hydrophobic functional groups Y can be exposed on the surface of the first interlayer 12 after hydrolysis and condensation reactions. Thereby, a hydrophobic surface is formed (referred to as a first release surface here).

Subsequently, the step S02 is performed to dispose a first glass substrate 13 on the first interlayer 12 to form a first substrate unit U1 (referred to as a substrate unit U1). Here, air between the first glass substrate 13 and the first interlayer 12 is excluded by, for example, vacuum lamination or stamping with a stamping machine so as to generate a pressure difference between two sides of the first glass substrate 13. Thereby, the first glass substrate 13 is disposed on the first carrier plate 11 having the first interlayer 12 by atmospheric pressure and the electrostatic force between the first glass substrate 13 and the first interlayer 12. In the embodiment, as shown in FIG. 2A, a roller A is used to extrude air between the first glass substrate 13 and the first interlayer 12 (stamping with a stamping machine) to dispose the first glass substrate 13 on the first interlayer 12. For better utilization of glass, the size of the first glass substrate 13 cannot be much less than that of the first carrier plate 11. Preferably, the edge of the first glass substrate 13 is located about 1 to 2 mm distant from the edge of the first carrier plate 11. The thickness of the first glass substrate 13 is less than that of the first carrier plate 11, and the thickness of the first interlayer 12 is less than that of the first glass substrate 13. Here, the thickness of the first glass substrate 13 may be between 0.05 mm and 0.3 mm (0.05 mm≤the thickness of the first glass substrate 13≤0.3 mm, and the thickness of the first interlayer 12 may be between 0.01 μm and 2 μm (0.01 μm≤the thickness of the first interlayer 12≤2 μm). The material of the first glass substrate 13 may be glass. The first glass substrate 13 itself can be a support, and itself is flexible, chemical-resistant and capable of blocking water and oxygen. Thus, it can be used as a substrate for an organic light-emitting diode (OLED) display, a liquid crystal display (LCD) or a light-emitting diode (LED) display. Moreover, the first glass substrate 13 can tolerate higher temperature in comparison with the first interlayer 12 to accomplish the above-mentioned processes for low temperature poly silicon and other devices or other processes such as laser debonding or laser curing.

The surface roughness of the material of the first interlayer 12 needs to be less than 10 nm RMS (root mean square). The excessive surface roughness will cause insufficient contact area so bad attaching, bubbles, mura or the like may occur. These problems easily cause the abnormal misjudgment at an inspection station in subsequent processes, or the peeling at the interface between the first glass substrate 13 and the first carrier plate 11 occurs due to reagents seeping into the interface in the processes.

In the first interlayer 12, the first release surface (namely hydrophobic surface) is a surface adjacent to (facing) the first glass substrate 13. The hydrophilic/hydrophobic properties of the first release surface relate to the adhesion force between the first interlayer 12 and the first glass substrate 13. Therefore, dilution ratios between the above-mentioned compounds and solvents can be changed, or bondings between hydrophobic functional groups Y and X can be more selectively broken by an illumination process to adjust the proportion of exposed hydrophobic functional groups Y. Then, the hydrophilic/hydrophobic properties of the hydrophobic surface can be controlled (namely the water contact angle can be controlled), so the adhesion force between the first interlayer 12 and the first carrier plate 11 is greater than that between the first interlayer 12 and the first glass substrate 13. Accordingly, a subsequent separation of the first interlayer 12 and the first glass substrate 13 becomes easier. Here, the water contact angle of the first release surface (hydrophobic surface) of the first interlayer 12 may be between 40° and 90°, preferably, between 50° and 80°.

In another embodiment, if the first interlayer 12 is a polymer layer formed by organic polymers, a surface modification method can be used to modify the surface of the first interlayer 12. Here, the surface modification method may include an ionized gas treatment, UV irradiation, or a wet chemical treatment. Thereby, the hydrophobic functional groups Y is exposed on the surface of the first interlayer 12 to form a hydrophobic surface.

Figure 2C:
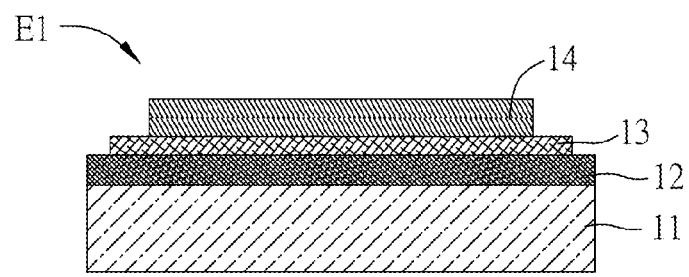

Subsequently, as shown in FIG. 2C, the step S03 is performed to form a first device layer 14 on the first glass substrate 13 to obtain a first device substrate E1 (referred to as a device substrate E1). Here, the first device layer 14 may include a thin film transistor (TFT) device, a color filter, an organic light emitting diode unit (including a TFT device and an organic light emitting device), or a touch device. The material of the active layer of the above-mentioned TFT device may be the above mentioned amorphous silicon, amorphous indium gallium zinc oxide, c-axis aligned crystal indium gallium zinc oxide, or low temperature poly silicon. In the embodiment, the first device layer 14 includes an organic light emitting diode unit, and the first device substrate E1 is an organic light emitting diode substrate.

Figure 2D:
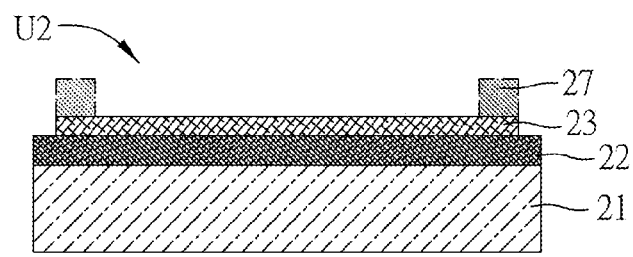

Then, as shown in FIG. 2D, the step S04 is to provide a second carrier plate 21 and form a second interlayer 22 on the second carrier plate 21; the step S05 is to dispose a second glass substrate 23 on the second interlayer 22 to form a second substrate unit U2. Here, the step S04 can refer to the above step S01, the step S05 can refer to the above step S02, so they are not repeated here. For example, the second substrate unit U2 can be obtained first (the step S04 to S05) and then the first device substrate E1 is obtained (the step S01 to S03), or they can be performed simultaneously, and the order is not limited thereto. The materials of the second carrier plate 21, the second interlayer 22, and the second glass substrate 23 may be the same as those of the first carrier plate 11, the first interlayer 12, and the first glass substrate 13, but they are not limited thereto.

Figure 2E:
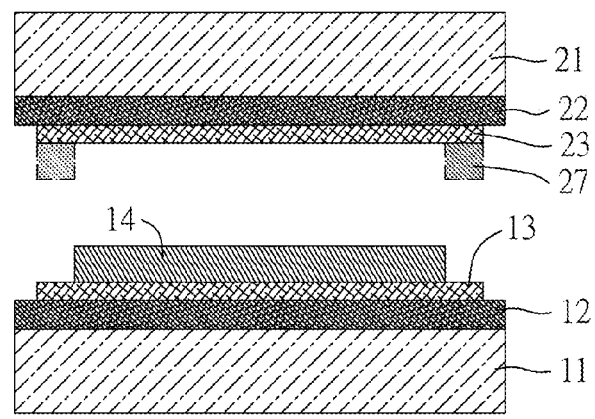
Figure 2F:
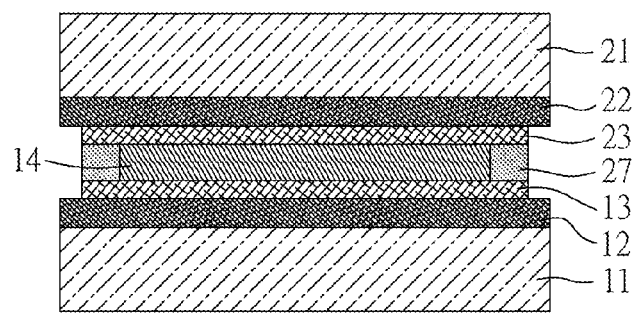

Then, the step S06 is performed to oppositely place and then combine the second substrate unit U2 and the first device substrate E1. However, in the embodiment, before the step S06 of oppositely placing and then combining the second substrate unit U2 and the first device substrate E1 is performed, as shown in FIG. 2D, the method for manufacturing the display device can further comprise: forming a sealing layer 27 on the outer periphery of the second glass substrate 23. Here, the sealing layer 27 is a frit, and a pre-sintering process can be performed on the sealing layer 27 for example by heat energy (e.g. a laser beam, a high temperature of 400° C. to 500° C.), and then the step S06 of oppositely placing and then combining the second substrate unit U2 and the first device substrate E1 is performed as shown in FIG. 2E. Here, the second substrate unit U2 is inverted and combined with the first device substrate E1, and then the sealing layer 27 is heated from the upper surface of the second carrier plate 21 by heat energy of higher temperature (e.g. a laser beam, a high temperature of 500° C. to 800° C.). Thus, as shown in FIG. 2F, an enclosed space is formed by the sealing layer 27, the first glass substrate 13, and the second glass substrate 23 (this is a sintering sealing process), so the first device layer 14 is located in the enclosed space. Moreover, a linear or planar sealant structure may exist between the sealing layer 27 and the first device layer 14, and a linear or planar sealant structure also may exist between the sealing layer 27 and the fringes of the first glass substrate 13 or the second glass substrate 23 for sealing or support. Furthermore, a transparent filler layer may exist between the first device layer 14, the second glass substrate 23, and the sealing layer 27. The enclosed space can be filled with the transparent filler layer to support the height of the space, and light can penetrate the transparent filler layer. A spacer may exist between the first device layer 14 and the second glass substrate 23 for supporting the height of the space.

Figure 2G:
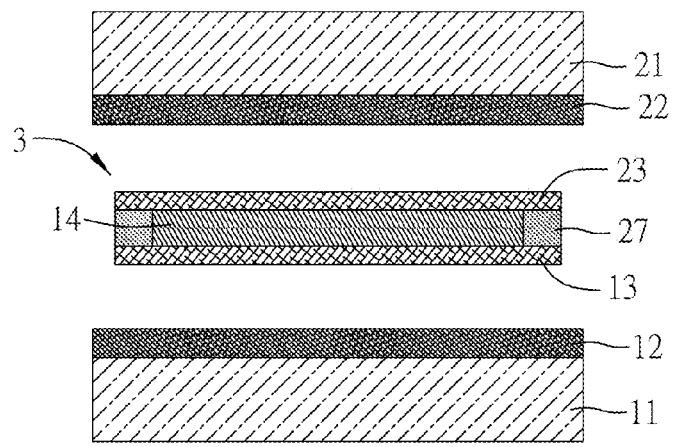

Finally, as shown in FIG. 2G, the step S07 is performed to separate the first glass substrate 13 from the first interlayer 12 and separate the second glass substrate 23 and the second interlayer 22 to obtain the display device 3. The first interlayer 12 has a first release surface (hydrophobic surface) whose water contact angle is between 40° and 90°, and the adhesion force between the first interlayer 12 and the first carrier plate 11 is greater than that between the first interlayer 12 and the first glass substrate 13. Therefore, a knife, for example, can be inserted between the first interlayer 12 and the first glass substrate 13 to break the vacuum between the first interlayer 12 and the first glass substrate 13 so as to separate the first glass substrate 13 from the first interlayer 12. Similarly, the second glass substrate 23 is separated from the second interlayer 22 to obtain the display device 3. Here, the display device 3 is an OLED display device. The order of the above-mentioned separation of the first glass substrate 13 from the first interlayer 12 and the separation of the second glass substrate 23 from the second interlayer 22 is not limited.

Accordingly, the above substrate unit (U1, U2), device substrate (E1) and the display device 3 can be produced using the existing manufacturing equipment, and the display device 3 can also meet the large-scale, thin and lightweight requirements. In addition, subsequent to the step S07, the first carrier plate 11 and the second carrier plate 21 can be recycled for reuse after the first carrier plate 11 and the first interlayer 12 in FIG. 2G are separated and the second carrier plate 21 and the second interlayer 22 are separated.

The display device 3 is further illustrated below with FIG. 2G. The display device 3 includes a first glass substrate 13, a second glass substrate 23, a first device layer 14 (referred to as device layer), and a sealing layer 27. Here, the first device layer 14 is disposed between the first glass substrate 13 and the second glass substrate 23. The sealing layer 27 is disposed between the first glass substrate 13 and the second glass substrate 23. An enclosed space is formed by the sealing layer 27, the first glass substrate 13 and the second glass substrate 23. The first device layer 14 is disposed in the enclosed space. The thicknesses of the first glass substrate 13 and the second glass substrate 23 are respectively between 0.05 mm and 0.3 mm, and the exterior surfaces of the first glass substrate 13 and the second glass substrate 23 are smooth surfaces without etched dimples. Here, that "the exterior surfaces of the first glass substrate 13 and the second glass substrate 23 are smooth surfaces without etched dimples" indicates that the first glass substrate 13 and the second glass substrate 23 of the display device 3 are not thinned by conventional chemical etching method (e.g. chemical thinning by hydrofluoric acid (HF)) but directly produced by the above-mentioned steps of the method for manufacturing display device. Therefore, there are not etched dimples (pits) caused by the etching process on the surface of the display device 3.

In the embodiment, the first device layer 14 may include an OLED unit, the sealing layer 27 may be a frit, and the display device 3 is an OLED display device. In another embodiment, the first device layer 14 may include a combination of a TFT device and a color filter and a plurality of liquid crystal molecules, and the sealing layer 27 may be a sealant, so the display device 3 is a liquid crystal display device. In addition, in another embodiment, the display device 3 may further include an electrode layer (not shown in figures) which is disposed on an exterior surface of the second glass substrate 23 away from the first glass substrate 13. Here, the electrode layer may be a touch electrode layer (including a drive electrode and a sensing electrode, Tx and Rx). For example, indium tin oxide (ITO) may be formed on the upper surface of the second glass substrate 23 by a low temperature process (e.g. less than 120° C.), so the display device 3 is a display device with a touch function.

Moreover, the manufacturing process of the display device according to the second embodiment is illustrated with FIG. 1 and FIGS. 3A to 3F. Here, FIGS. 3A to 3F are schematic diagrams of the manufacturing process of the display device 3a according to the second embodiment.

Figure 3A:
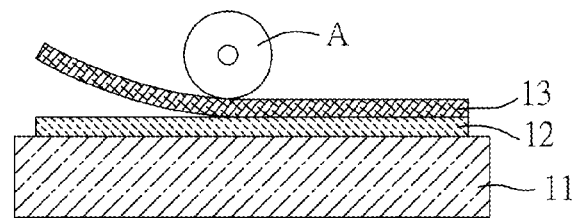
FIG. 3A to FIG. 3F are schematic diagrams of the manufacturing process of the display device according to the second embodiment.
Figure 3B:
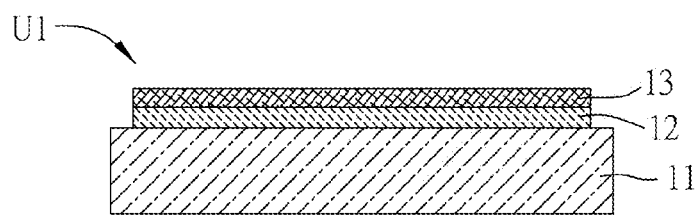
Figure 3C:
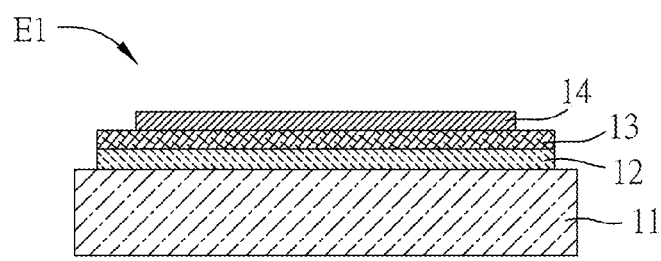
Figure 3D:
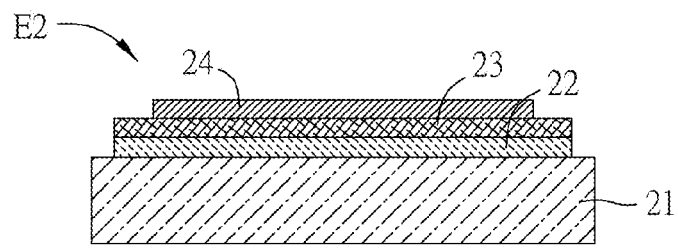

The method for manufacturing the display device 3a is similar to the above-mentioned steps S01 to S05, so it is not repeated here. As shown in FIG. 3C, the first device layer 14 of the embodiment includes a TFT device, and the first device substrate E1 is a TFT substrate. Moreover, compared with the method for manufacturing the display device 3, before the step S06 of oppositely placing and then combining the second substrate unit U2 (not shown in figures) and the first device substrate E1, as shown in FIG. 3D, the method for manufacturing the display device 3a in the embodiment can further include: forming a second device layer 24 on the second glass substrate 23 to obtain a second device substrate E2. Here, the second device layer 24 includes a color filter, and the second device substrate E2 is a color filter substrate.

Figure 3E:
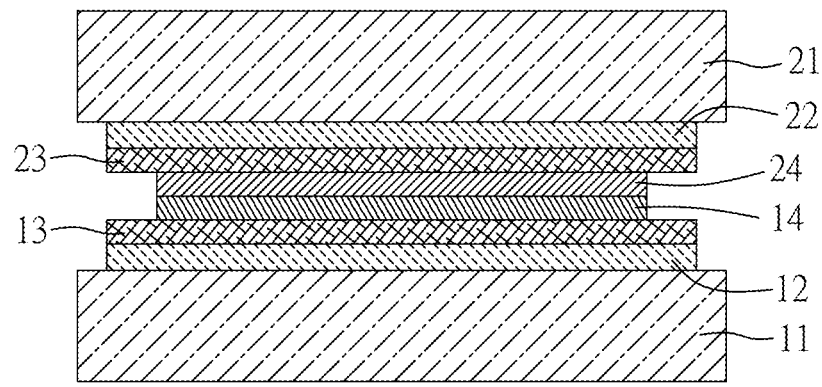

Then, the step S06 is performed. As shown in FIG. 3E, the second substrate unit U2 (the second device substrate E2) is inverted to make the second substrate unit U2 (the second device substrate E2) and the first device substrate E1 oppositely placed, and then the second substrate unit U2 (the second device substrate E2) is combined with the first device substrate E1.

Figure 3F:
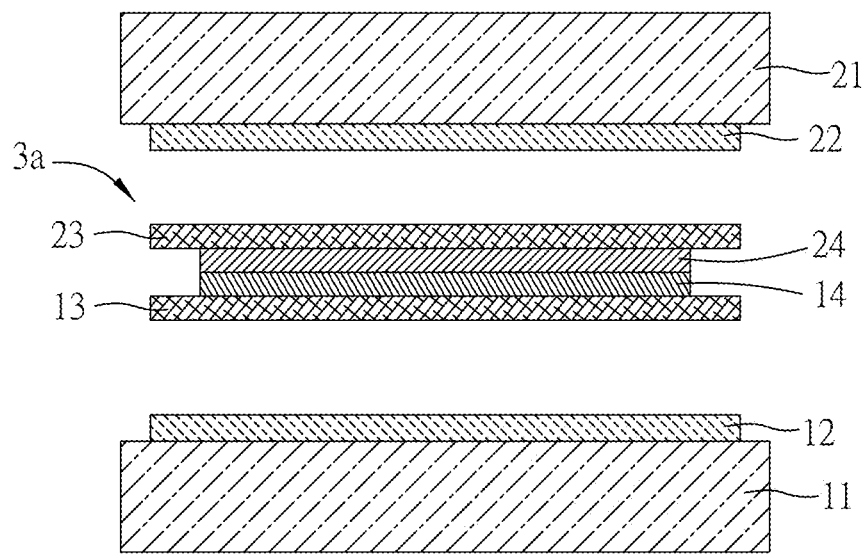

Finally, as shown in FIG. 3F, the step S07 is performed to separate the first glass substrate 13 from the first interlayer 12 and separate the second glass substrate 23 from the second interlayer 22 to obtain the display device 3a. Here, a knife, for example, can be inserted between the first interlayer 12 and the first glass substrate 13 to break the vacuum between the first interlayer 12 and the first glass substrate 13 so as to separate the first glass substrate 13 from the first interlayer 12. Similarly, the second glass substrate 23 is also separated from the second interlayer 22 to obtain the display device 3a. In the embodiment, the display device 3a is a liquid crystal display device. Therefore, before the combination of the above-mentioned step S06, a space on the first device substrate E1 surrounded by a sealant can be filled with liquid crystal molecules by, for example but not limited to, one drop filling (ODF), and then the second device substrate E2 is combined with the first device substrate E1.

Moreover, other illustrations of the display device 3a and the manufacturing method thereof may refer to the corresponding elements of the above display device 3 and the manufacturing method thereof, so they are repeated here.

Moreover, the manufacturing process of the display device according to the third embodiment is illustrated with FIG. 1 and FIGS. 4A to 4F. FIGS. 4A to 4F are schematic diagrams of the manufacturing process of the display device 3b according to the third embodiment.

Figure 4A:
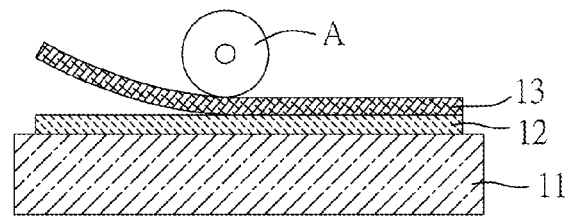
FIG. 4A to FIG. 4F are schematic diagrams of the manufacturing process of the display device according to the third embodiment.
Figure 4B:
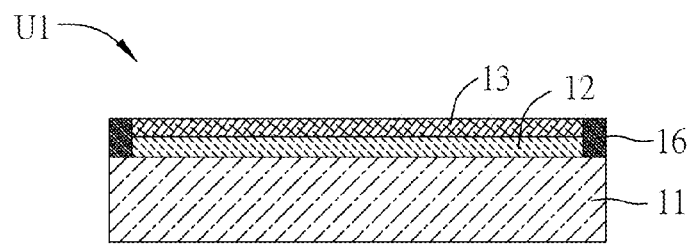

The method for manufacturing the display device 3b similarly includes the above-mentioned step S01 and step S02. However, before the step S03 of forming the first device layer 14 on the first glass substrate 13, as shown in FIG. 4B, the method for manufacturing the display device 3b further includes: forming a first function layer 16 on the first carrier plate 11. The first glass substrate 13 is directly disposed on the first interlayer 12, the first function layer 16 is disposed on the lateral peripheries of the first interlayer 12 and the first glass substrate 13. The first function layer 16 connects the first carrier plate 11 and the first glass substrate 13. The first function layer 16 can prevent the reagents in the subsequent processes from seeping into the interface between the first glass substrate 13 and the first interlayer 12 and from damaging the function of the first interlayer 12. Thus, the separation of the first glass substrate 13 and the first interlayer 12 can be easier in the subsequent processes. Because the distance between edges of the first glass substrate 13 and the first carrier plate 11 is 1 mm to 2 mm and the distance between edges of the first interlayer 12 and the first carrier plate 11 is 2 mm to 5 mm, the first glass substrate 13 and the first carrier plate 11 may still be attached and cannot be separated after the high temperature process due to the area of the first carrier plate 11 not covered by the first interlayer 12. Therefore, the first function layer 16 is disposed on the lateral peripheries of the first interlayer 12 and the first glass substrate 13 and covers the area of the first carrier plate 11 that is not covered by the first interlayer 12. The viscosity of the first function layer 16 has to be between 3 and 15 cps to avoid the effusion to the back of the first carrier plate 11 and avoid subsequent contamination to equipment. Moreover, the range that the surface of the first glass substrate 13 is coated with the first function layer 16 is between 0 μm and 500 μm, which avoids that the material cannot be filmed on the surface of the first glass substrate 13 in subsequent device process.

Figure 4C:
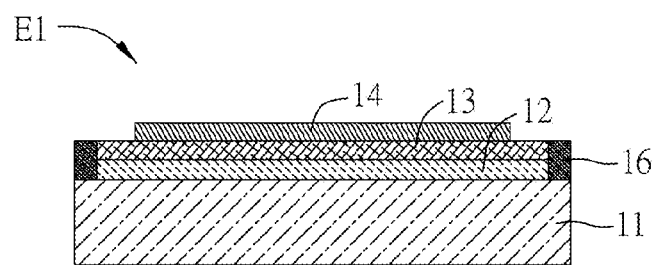
Figure 4D:
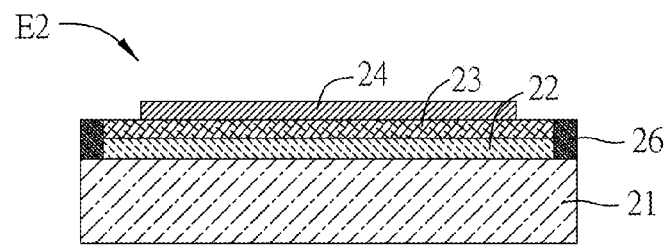
Figure 4E:
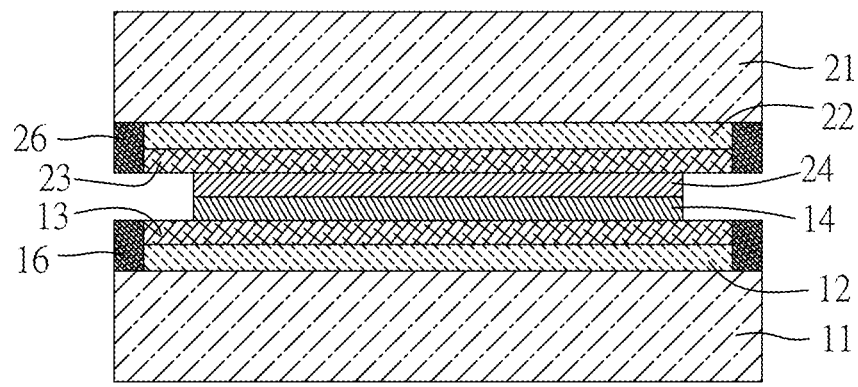

Later, as shown in FIG. 4C, the step S03 is further performed to form the first device layer 14 on the first glass substrate 13 to obtain the first device substrate E1. Similarly, before forming the second device layer 24 on the second glass substrate 23, as shown in FIG. 4D, the method for manufacturing the display device 3b may further include: forming a second function layer 26 on the second carrier plate 21. The second function layer 26 is disposed on the lateral peripheries of the second interlayer 22 and the second glass substrate 23 to obtain the second device substrate E2. In the embodiment, the materials of the first function layer 16 and the second function layer 26 may respectively be metal, metal oxides, silicon oxides, organosilicon compounds, organotitanium compounds, organoaluminum compounds, or organic polymers, and they are not limited thereto.

Then, the step S06 (FIG. 4E) and the step S07 (FIG. 4F) may refer to above description, so they are not repeated here. In the manufacturing process of the display device 3b according to the embodiment, the first device layer 14 includes a TFT device, the first device substrate E1 is a TFT substrate, the second device layer 24 includes a color filter, and the second device substrate E2 a color filter substrate.

Figure 4F:
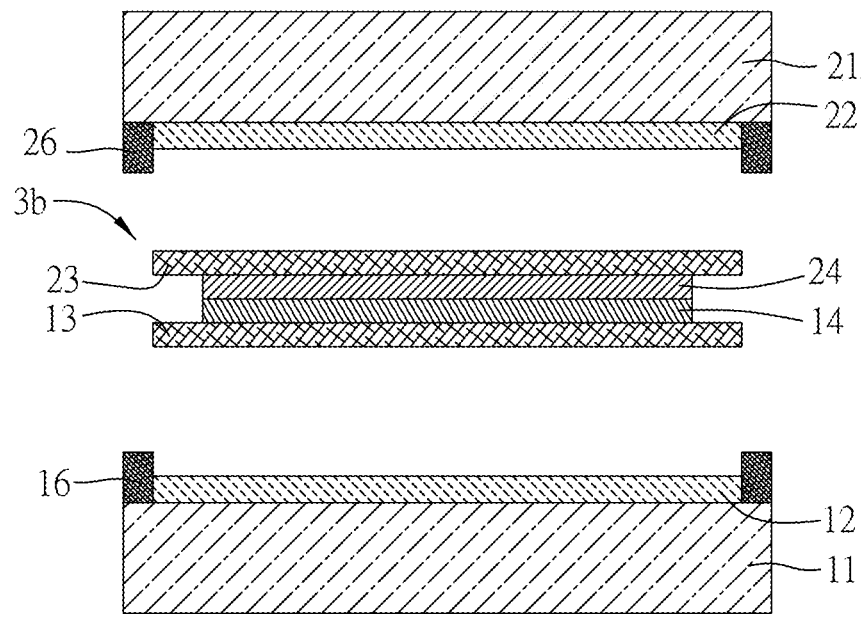

Therefore, the display device 3b in FIG. 4F is a liquid crystal display device.

In addition, other illustrations of the display device 3b and the manufacturing method thereof may refer to the corresponding elements of the above display devices 3, 3a and the manufacturing methods thereof, so they are repeated here.

Moreover, the manufacturing process of the display device according to the fourth embodiment is illustrated with FIG. 1 and FIGS. 5A to 5F. Here, FIGS. 5A to 5F are schematic diagrams of the manufacturing process of the display device 3c according to the fourth embodiment.

Figure 5A:
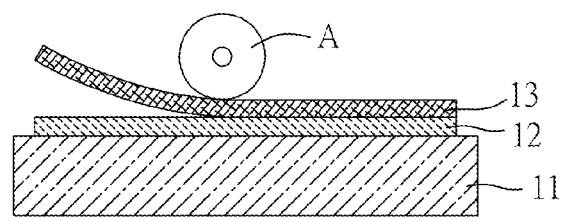
FIG. 5A to FIG. 5F are schematic diagrams of the manufacturing process of the display device according to the fourth embodiment.
Figure 5B:
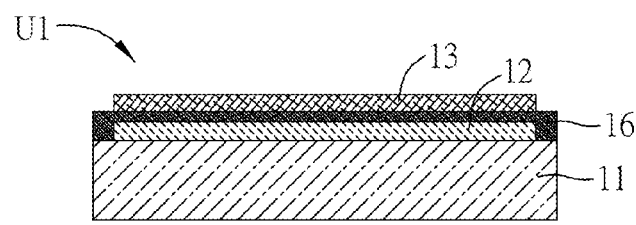
Figure 5C:
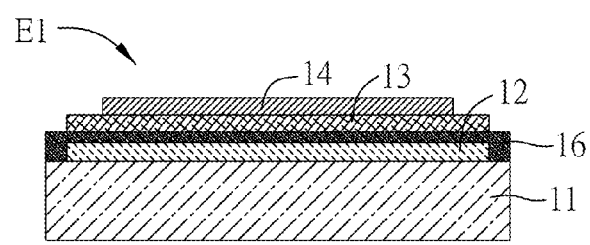
Figure 5D:
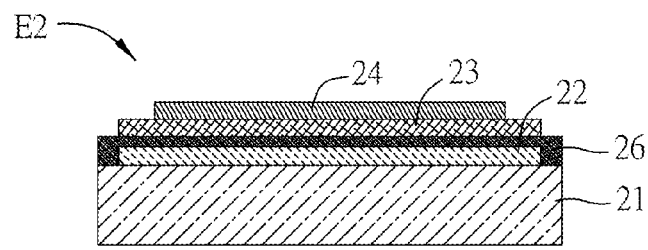
Figure 5E:
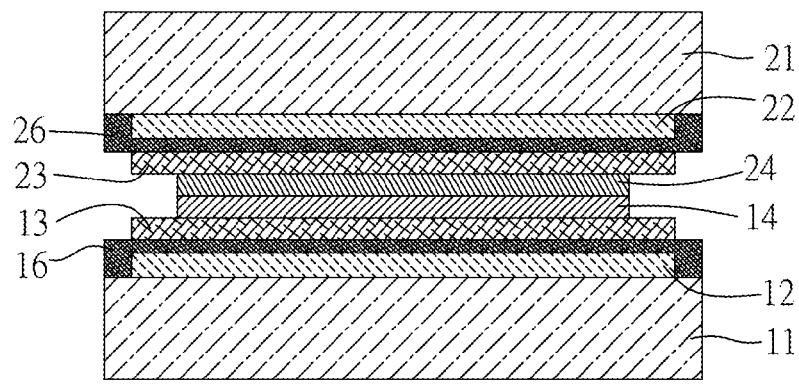
Figure 5F:
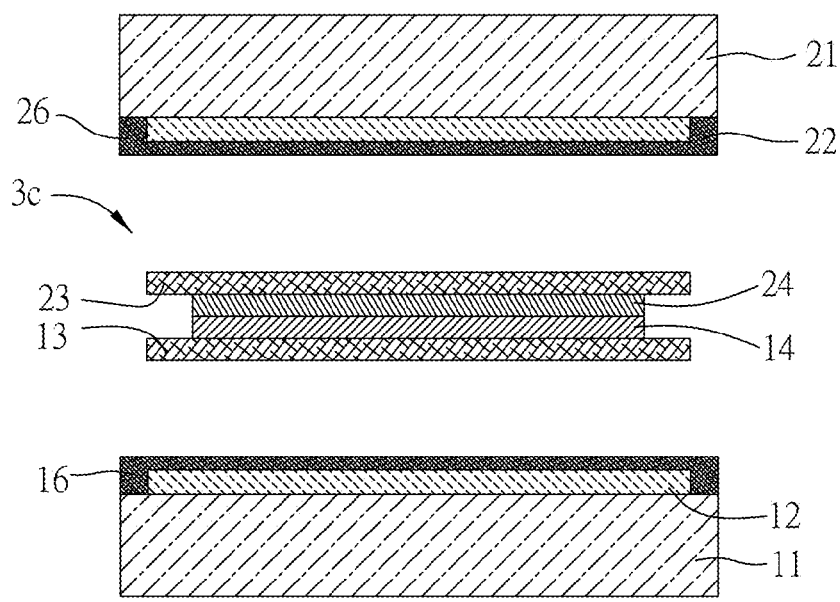

A difference between the methods for manufacturing the display device 3c and the display device 3b is that, as shown in FIGS. 5B and 5C, the first function layer 16 covers the lateral periphery and the upper surface of the first interlayer 12 in the manufacturing process of the display device 3c, so the first function layer 16 may be between the first interlayer 12 and the first glass substrate 13. Similarly, as shown in FIG. 5D, the second function layer 26 covers the lateral periphery and the upper surface of the second interlayer 22, and the second function layer 26 may be between the second interlayer 22 and the second glass substrate 23. Because the step S06 (FIG. 5E) and the step S07 (FIG. 5F) may refer to the above description, they are not repeated here. In the manufacturing process of the display device 3c according to the embodiment, the first device layer 14 includes a TFT device, the first device substrate E1 is a TFT substrate, the second device layer 24 includes a color filter, and the second device substrate E2 is a color filter substrate. Therefore, the display device 3c in FIG. 5F is also a liquid crystal display device.

Moreover, other illustrations of the display device 3c and the manufacturing method thereof may refer to the same devices of the above display devices 3, 3a, 3b and the manufacturing methods thereof, so they are repeated here.

Figure 6:
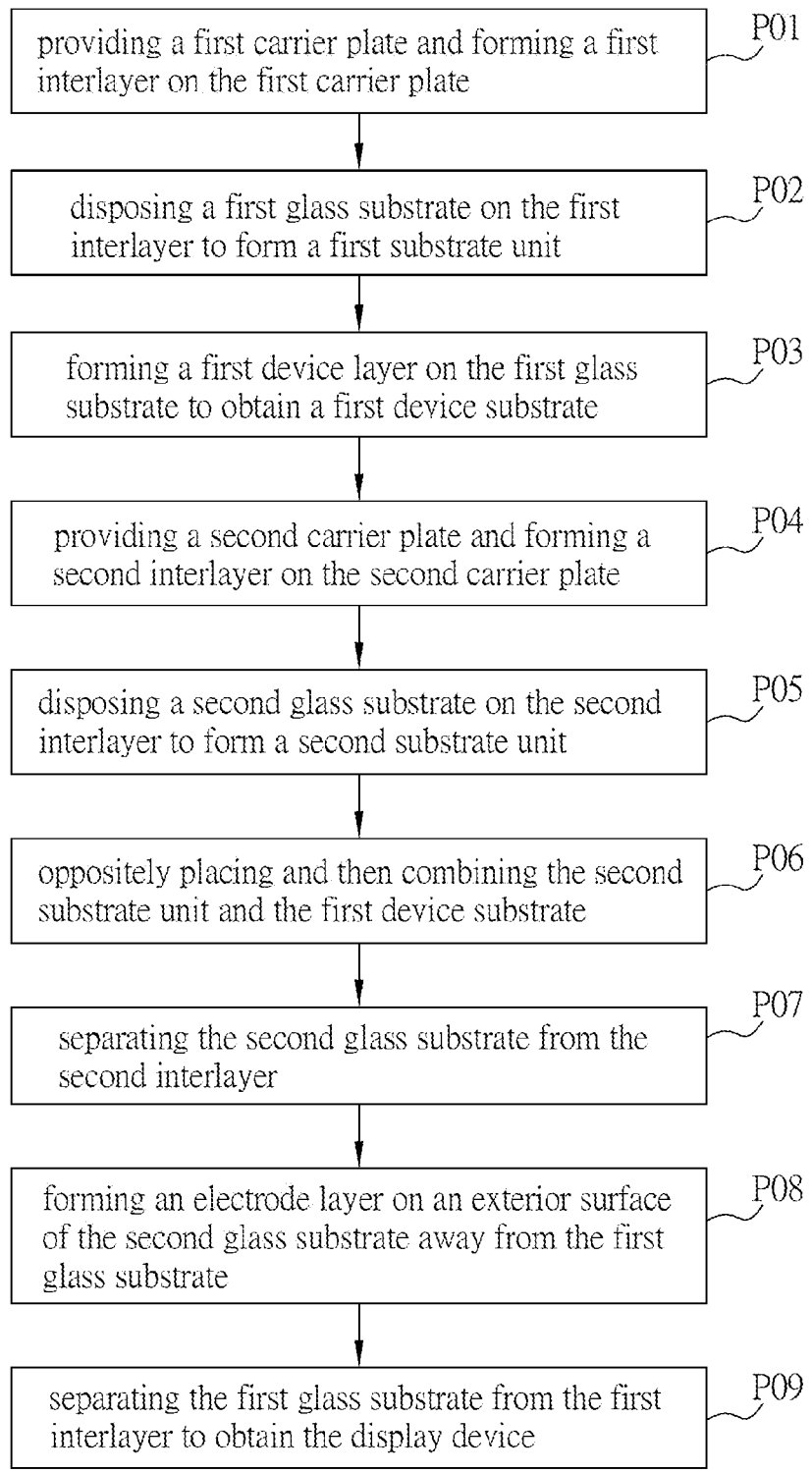
FIG. 6 is a flow chart of the steps of the method for manufacturing a display device according to another embodiment.

Then, the manufacturing process of the display device according to the fourth embodiment is illustrated with FIG. 6 and FIGS. 7A to 7D. Here, FIG. 6 is a flow chart of steps of a method for manufacturing a display device according to another preferred embodiment, and FIGS. 7A to 7D are schematic diagrams of the manufacturing process of the display device 3d according to the fourth embodiment.

Figure 7A:
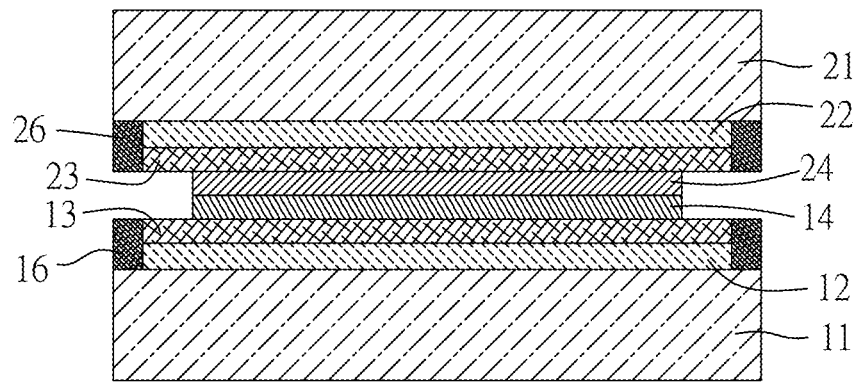
FIG. 7A to FIG. 7D are schematic diagrams of the manufacturing process of the display device according to the fourth embodiment.
Figure 7B:
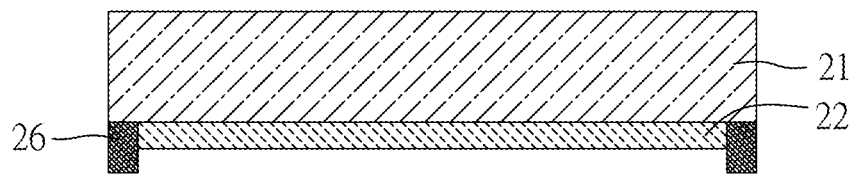
Figure 7B:
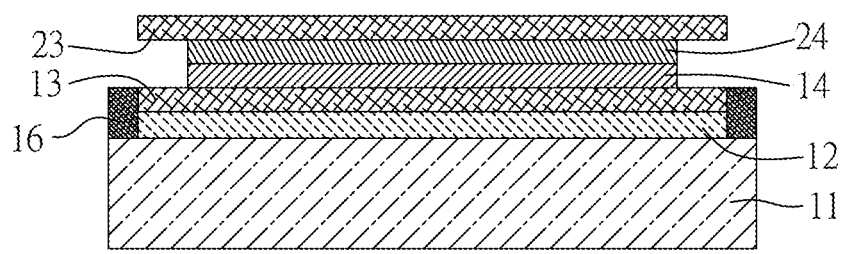

As shown in FIG. 6, the method for manufacturing the display device according to the fourth embodiment includes the steps P01 to P09. Because the steps P01 to P06 are the same as the steps S01 to S06 and they can refer to the above description, they are repeated here. Accordingly, after the process of the step P01 to the step P06, the display device 3d according to the fourth embodiment has the structure as shown in FIG. 7A. Then, as shown in FIG. 7B, the step P07 is performed to separate the second glass substrate 23 from the second interlayer 22. Here, a knife, for example, can be inserted between the second glass substrate 23 and the second interlayer 22 to break the vacuum between the second glass substrate 23 and the second interlayer 22 so as to separate the second glass substrate 23 and the second interlayer 22.

Figure 7C:
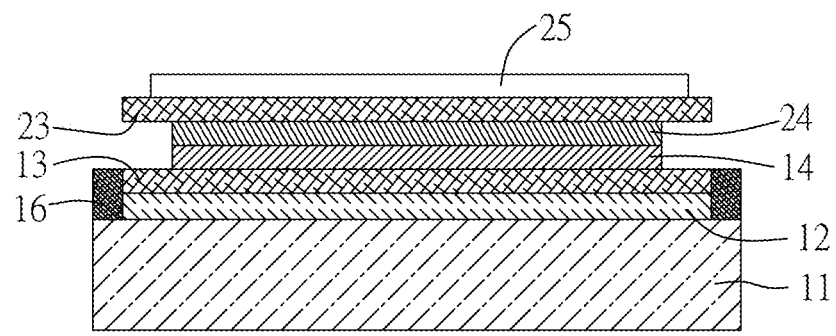

Because the total thickness of Cell according to the embodiment (0.5t/0.2t/0.2t) is close to the thickness of a product produced by conventional technology (0.5t/0.5t), a process of forming a touch electrode (namely touch on display, TOD) can be directly performed. As shown in FIG. 7C, the step P08 is performed to form an electrode layer 25 on an exterior surface of the second glass substrate 23 away from the first glass substrate 13. Here, the electrode layer 25 is a touch electrode layer (including a drive electrode and a sensing electrode, Tx and Rx). For example, ITO is formed on the upper surface of the second glass substrate 23 by a low temperature process (e.g. less than 120° C.). In this step, if manufacturing the electrode layer 25 is not successful, the electrode layer 25 can be reworked. Therefore, the yield rate of product can be improved.

Figure 7D:
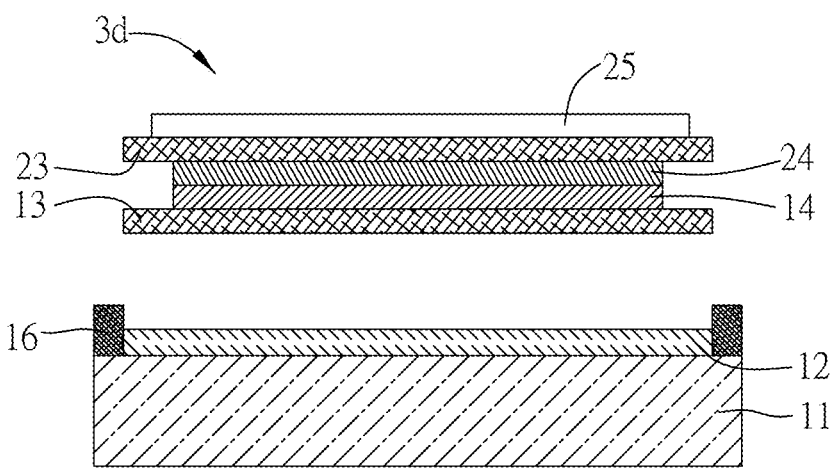

Finally, as shown in FIG. 7D, the step P09 is further performed to separate the first glass substrate 13 from the first interlayer 12 to obtain the display device 3d. Therefore, the display device 3d according to the embodiment includes the first glass substrate 13, the first device layer 14, the second glass substrate 23, the second device layer 24 and the electrode layer 25, and it is a liquid crystal display device with a touch function.

In addition, other illustrations of the display device 3d and the manufacturing method thereof may refer to the corresponding elements of the above display devices 3, 3a, 3b, 3c and the manufacturing methods thereof, so they are repeated here.

It should be noted that the structures and the features of the first function layer 16 and the second function layer 26 in the manufacturing process of the display device 3d are the same as those of the first function layer 16 and the second function layer 26 of the display device 3b. However, in the different embodiment, the structures and the features of the first function layer 16 and the second function layer 26 in the manufacturing process of the display device 3d may also be the same as those in the manufacturing process of the display device 3c. Moreover, a person skilled in the art may also apply the step P07 to the step P09 of the manufacturing process of the display device 3d according to the fourth embodiment to the display devices 3, 3a, 3b, and 3c so as to make the display devices 3, 3a, 3b, and 3c have touch functions, so the process is not repeated here.

In summary, the method for manufacturing the display device according to the disclosure includes the steps of: providing a first carrier plate and forming a first interlayer on the first carrier plate; disposing a first glass substrate on the first interlayer to form a first substrate unit; forming a first device layer on the first glass substrate to obtain a first device substrate; providing a second carrier plate and forming a second interlayer on the second carrier plate; disposing a second glass substrate on the second interlayer to form a second substrate unit; oppositely placing and then combining the second substrate unit and the first device substrate; and separating the first glass substrate from the first interlayer and separating the second glass substrate from the second interlayer to obtain the display device. Alternatively, the method further may include the steps of: separating the second glass substrate from the second interlayer; forming an electrode layer on an exterior surface of the second glass substrate away from the first glass substrate; and separating the first glass substrate from the first interlayer to obtain the display device. By the manufacturing process mentioned above, the substrate unit and the display device according to the disclosure can be produced using the existing manufacturing equipment, and the display device can meet the large-scale, thin and lightweight requirements.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A method for manufacturing a display device, comprising:
   providing a first carrier plate and forming a first interlayer on the first carrier plate;
   disposing a first glass substrate on the first interlayer to form a first substrate unit;
   forming a first device layer on the first glass substrate to obtain a first device substrate;
   providing a second carrier plate and forming a second interlayer on the second carrier plate;
   disposing a second glass substrate on the second interlayer to form a second substrate unit;
   oppositely placing and then combining the second substrate unit and the first device substrate; and separating the first glass substrate from the first interlayer and separating the second glass substrate from the second interlayer.

2. The method of claim 1, wherein the step of separating the first glass substrate from the first interlayer and separating the second glass substrate from the second interlayer comprises:
   first, separating the second glass substrate from the second interlayer;
   then, forming an electrode layer on an exterior surface of the second glass substrate away from the first glass substrate; and
   later, separating the first glass substrate from the first interlayer.

3. The method of claim 1, wherein before the step of forming the first device layer on the first glass substrate, the method further comprises:
   forming a first function layer on the first carrier plate, wherein the first function layer is disposed on the lateral peripheries of the first interlayer and the first glass substrate.

4. The method of claim 1, wherein before the step of disposing the first glass substrate on the first interlayer, the method further comprises:
   forming a first function layer covering the lateral periphery and the upper surface of the first interlayer, wherein the first function layer is between the first interlayer and the first glass substrate.

5. The method of claim 1, wherein before the step of disposing the second glass substrate on the second interlayer, the method further comprises:
   forming a second function layer covering the lateral periphery and the upper surface of the second interlayer, wherein the second function layer is between the second interlayer and the second glass substrate.

6. The method of claim 1, wherein before the step of oppositely placing and then combining the second substrate unit and the first device substrate, the method further comprises:
   forming a sealing layer on the outer periphery of the second glass substrate.

7. The method of claim 6, wherein after the step of oppositely placing and then combining the second substrate unit and the first device substrate, the method further comprises:
   heating the sealing layer to form an enclosed space by the sealing layer, the first glass substrate and the second glass substrate.

8. The method of claim 1, wherein the thickness of the first glass substrate is less than that of the first carrier plate, and the thickness of the first interlayer is less than that of the first glass substrate.

* * * * *